United States Patent [19]

Shafer et al.

[11] 4,356,503
[45] Oct. 26, 1982

[54] LATCHING TRANSISTOR

[75] Inventors: Peter O. Shafer; E. Duane Wolley, both of Auburn, N.Y.

[73] Assignee: General Electric Company, Syracuse, N.Y.

[21] Appl. No.: 125,413

[22] Filed: Feb. 28, 1980

Related U.S. Application Data

[63] Continuation of Ser. No. 915,563, Jun. 14, 1978, abandoned.

[51] Int. Cl.³ .............................................. H01L 29/74
[52] U.S. Cl. ........................................ 357/38; 357/20; 357/36; 357/86
[58] Field of Search ..................... 357/38, 86, 20, 36

[56] References Cited

U.S. PATENT DOCUMENTS

| | | | |
|---|---|---|---|
| 3,324,359 | 6/1967 | Gentry | 357/38 |
| 3,504,242 | 3/1970 | Wolley | 357/86 |
| 3,609,476 | 9/1971 | Storm | 357/38 |
| 3,619,738 | 11/1971 | Otsuka | 357/38 |
| 3,914,781 | 10/1975 | Matsushita et al. | 357/38 |

FOREIGN PATENT DOCUMENTS 52-2287  1/1977  Japan ..................................... 357/38

Primary Examiner—Joseph E. Clawson, Jr.
Attorney, Agent, or Firm—Robert J. Mooney

[57] ABSTRACT

A latching transistor is described having both high current capacity and high turn-off gain. A selectively shorted anode emitter provides a four-layer structure capable of sustaining current flow only under those portions of a cathode emitter adjacent interdigitated gate fingers and particularly not in the center of the cathode emitter fingers or beneath contact areas. Additionally, a control region is provided for conveniently adjusting the amount of anode emitter shorting for optimizing turn-off speed, foward voltage drop, and gate triggering characteristics.

2 Claims, 6 Drawing Figures

LATCHING TRANSISTOR

This is a continuation, of application Ser. No. 915,563, filed June 14, 1978 now abandoned.

This invention relates in general to latching transistors and more particularly to an improved latching transistor having a selectively shorted anode emitter for reducing the on-state current flow in both the center portion of one or more emitter fingers of an interdigitated gate-cathode emitter structure and also beneath a relatively large, relatively high current-carrying capacity cathode electrode connection region.

Latching transistors, which are oftentimes called gate turn-off thyristors (GTO's), are becoming increasingly widely employed circuit elements in solid state power conditioning systems such as inverters, choppers, switching mode power supplies, and the like. Within their power capabilities, they exhibit the significant advantage over conventional thyristors that they can be turned off as well as on by the application of an appropriately poled gate signal without the necessity for otherwise reducing the current controlled by them to zero. Typically, the gate current required to switch a gate turn-off device from a conducting to a nonconducting state is larger than the current required to switch from a nonconducting to a conducting state. It is said that the turn-off gain is generally lower than the turn-on gain. The usefulness of gate turn-off thyristors is enhanced by increasing the turn-off gain. Recently, as described, for example, by Wolley et al., in "Characteristics of a 200 Amp Gate Turn Off Thyristor" (IEEE-IAS Conference Record dated 1973), it has been suggested that the turn-off gain of a GTO can be increased by providing an interdigitated cathode emitter structure which structure provides a longer turn-on and turn-off line than conventional non-interdigitated structures since more of the cathode emitter is physically close to the gate contact than in prior art designs.

Even with relatively narrow cathode emitter fingers, it has been recognized, see for example U.S. Pat. No. 3,504,342, that certain advantages may be obtained by providing a shorted anode emitter structure which limits or eliminates current flow in the center of the cathode emitter fingers of an interdigitated structure. The achievement of high current carrying capability in an interdigitated gate turn-off thyristor structure is to some extent incompatible with high turn-off gain. As the emitter fingers are made narrower, the ease of turning off the device increases but the current carrying capacity decreases. In an attempt to provide both high current carrying-capacity and high turn-off gain, a comb-like structure is oftentimes employed wherein a plurality of relatively narrow cathode emitter fingers extend from either one or two sides of a relatively wider edge or center spine portion, respectively, adapted to receive an electrode to which a relatively high current carrying-capacity wire or other terminal may be attached. The structure which results turns off relatively easily in the emitter finger area but with substantially more difficulty in the larger electrode connection area. In fact, in many instances, turn off is so difficult in the area of the device underlying the electrode connection area that the device may not turn off at all upon the application of a gate turn-off signal thereto, either returning to a conducting state after the gate signal is removed, or failing destructively due to excessive current density under the contact area.

It is an object of this invention to provide a latching transistor having both high current carrying-capacity and high turn-off gain.

It is another object of this invention to provide a latching transistor having an "on" V-I characteristic without the discontinuities of prior art types.

It is yet another object of this invention to provide a latching transistor having interconnecting regions for insuring that all of the emitter fingers are turned on especially where turn on is initiated only in one or more fingers, while at the same time not substantially degrading the turn-off characteristics of the device.

It is still another object of this invention to provide a latching transistor including an additional n+ region between the anode region and the higher resistivity n-type control region for limiting the spread of the depletion layer of the blocking p-n junction at high voltage and thus allowing for minimum n-type base width in order to minimize the on-stage forward voltage drop.

It is a further object of this invention to reduce the emitter efficiency of the anode emitter junction at high currents as well as low currents thus minimizing charge storage in the n-type base region of the thyristor for reducing tailing during turn-off and thereby decrease the turn-off time.

It is a still further object of this invention to provide a latching transistor having a control layer for the easy variation of the turn-on and turn-off characteristics of the device.

Briefly stated and in accordance with a presently preferred embodiment of this invention, an improved gate turn-off thyristor includes an interdigitated cathode emitter gate structure having a plurality of cathode emitter fingers and a plurality of gate fingers forming an interleaved comb-type structure. A selectively shorted anode emitter provides a four-layer structure capable of sustaining current flow only under those portions of the cathode emitter fingers adjacent the gate fingers, and particularly not in the center of the cathode emitter fingers or beneath the contact areas.

In accordance with another embodiment of this invention, a gate turn-off thyristor includes a plurality of pairs of closely-spaced cathode emitter regions sharing a common cathode emitter electrode, one region of each pair coupled with an adjacent region of an adjoining pair by a bridging region to provide for positive spreading of the turn-on region where the initial turn-on area is localized or otherwise non-uniform.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

Figure 1:
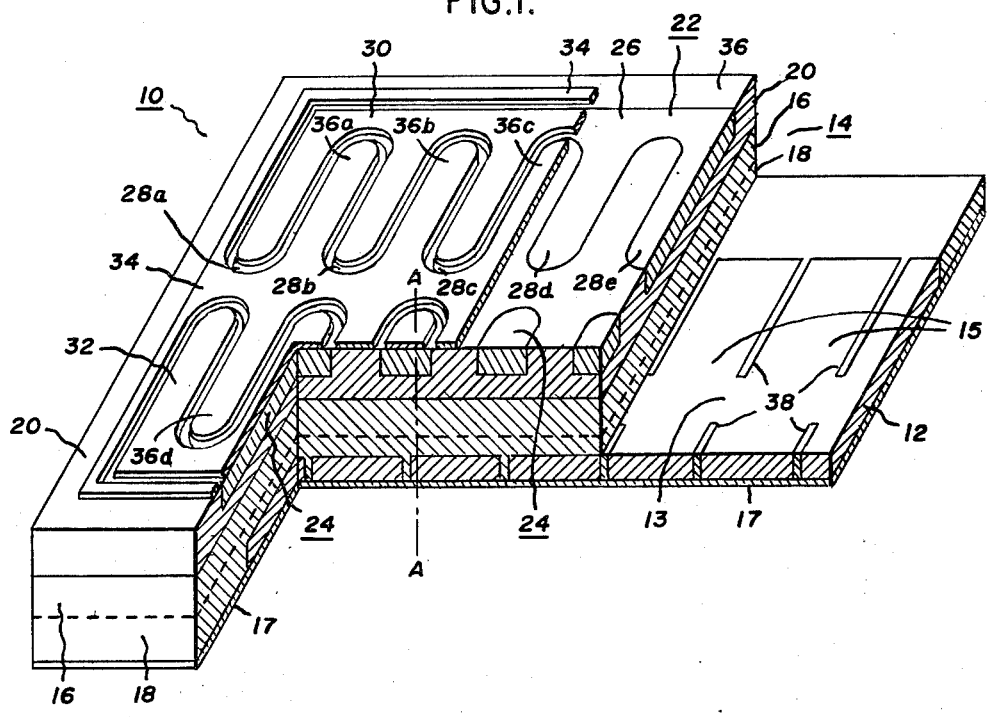
FIG. 1 is a cut-away, perspective view of a device in accordance with this invention.

An exemplary embodiment of a latching transistor in accordance with the teachings of this invention is illustrated in FIG. 1. The latching transistor 10 includes four semiconductor regions of alternating conductivity type. Anode region 12 is, in this exemplary embodiment, of p-conductivity type and may be formed by diffusion through a mask as is well-known to those skilled in the art. While the latching transistor herein described includes a p-type anode region 12, it will be understood by those skilled in the art that an analogous structure may be formed with an n-conductivity type region 12, corresponding changes being made to the other regions comprising the device.

P-type anode region 12 is formed in n-type base region 14 which preferably includes a relatively lightly doped upper portion 16 which may have an impurity concentration of about $10^{14}$ atoms/cm$^3$. Base region 14 also includes a more heavily doped lower region 18 which may conveniently have an impurity concentration of about $10^{17}$ atoms/cm$^3$. Preferably base layer 14 is of n-conductivity type, region 16 being conventionally designated as n-type while region 18 is designated n+ type. It should be understood that while providing a base region having a more heavily doped layer 18 yields certain advantages as have been hereinabove described, other advantages of this invention may be obtained in devices fabricated by providing an n-type base region of an impurity profile such as is attained by utilizing an originally n-type wafer into which the other regions as have been and will be described in conjunction with FIG. 1 are formed. P-type anode 12 is of essentially rectangular shape having a plurality of elongated slots extending from the edges of the region towards the center of region 12. Anode 12 may conveniently be described as including a central spine region 13 having a plurality of fingers 15 extending therefrom.

Overlying n-type base region 14 is p-type base region 20. Region 20 may be conveniently formed by diffusion from a source such as boron to an impurity concentration of about $10^{17}$ atoms/cm$^3$.

Two independent cathode regions 22 and 24 are formed in base region 20. Region 22 is essentially a mirror image of region 24 and includes a relatively wide spine area 26 to which contact may be easily made and a plurality of finger-like projections 28a, 28b, 28c, 28d, and 28e extending from contact area 26 towards the center of the device. Each of finger portions 28 conveniently has a width of about 300 micrometers while spine region 26 has a width of 600 micrometers so as to readily accommodate the attachment thereto of a relatively large wire, or the like, for carrying a substantial amount of current, on the order of many tens of amperes. Regions 22 and 24 are conveniently formed, as is well-known, by masked diffusion. Electrodes 30 and 32 overlie n-type cathode regions 22 and 24 respectively. Electrodes 30 and 32 are generally the same shape as regions 22 and 24 but smaller. Overlying p-type base region 20 and interdigitated with cathode regions 22 and 24 is gate electrode 34. Preferably, cathode electrodes 30 and 32 and gate electrode 34 are formed simultaneously by the deposition, for example by evaporation, of a metal layer on surface 36 of latching transistor 10 and the subsequent processing to form the three electrodes by suitable photolithographic masking and etching. Gate electrode 34 is preferably laterally spaced from the boundaries of cathode regions 22 and 24 by about 75 micrometers. Gate electrode 34 is seen to include a pluarlity of outwardly extending fingers 36a, 36b, 36c, 36d, 36e, and 36f which are interdigitated with cathode fingers 28 and cathode electrodes 30 and 32; a relatively wide (compared to fingers 36) central spine region to which a wire may be conveniently attached; and a relatively narrow outer portion surrounding cathode regions 22 and 24.

Slots 38 are positioned under the centers of cathode fingers 28 and form a shorted anode structure with respect thereto. Slots 38 extend, preferably at least, from a line connecting the centers of the radii of curvature of the ends of cathode fingers 28 to a line connecting the centers of the radii of curvature of the regions between cathode fingers 28, thus lying essentially only beneath the center portions of the cathode fingers and not beneath area 26 slots 38 may extend to the end of fingers 28 as shown in the figure.

The structure of latching transistor 10 forms a four-layer structure analogous to a thyristor only in those regions where cathodes 22 and 24, base 20, base 14, and anode 12 are vertically coincident.

Figure 2:
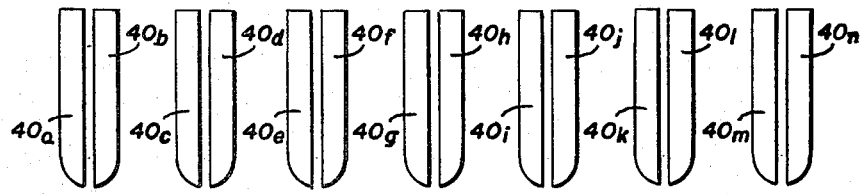
FIG. 2 is a plan view of the current-carrying portion of the device of FIG. 1.
Figure 2:
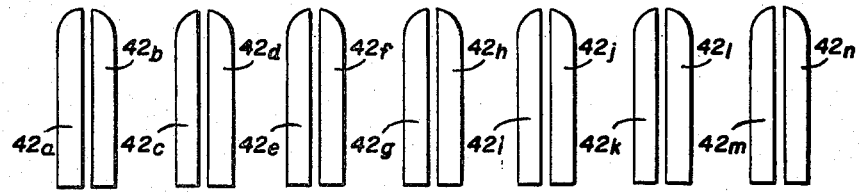

A composite view of the four-layer structure of the latching transistor of FIG. 1 is illustrated in FIG. 2. FIG. 2 shows an outline view of the portion of the device of FIG. 1 which is defined by the vertical coincidence of the cathode region 28, the first and second base regions 20 and 14, and the anode emitter 12. Therefore, FIG. 2 illustrates that portion of the entire device which is in fact a current-carrying portion when the device is in a conducting condition. Current-carrying portions 40a-n and 42a-n may be conveniently considered as occurring in pairs, ab, cd, ef, etc., each of which pairs will be seen to have the shape and outside dimensions of the overlying cathode emitter finger and having omitted therefrom a central shorted portion having the shape and dimensions of the slot between anode emitter fingers. The foregoing structure will be appreciated to include a plurality of discrete 4-layer sections, each pair of which is associated with a single cathode emitter finger, and all of which share the anode electrode of the device; for ease of comparison, the width of each of the finger portions which comprise a pair will be referred to as the emitter half width—this width is indicated as "W." In a gate turn-off mode, that is to say, when the device is conducting in the forward direction and a signal is applied to the gate terminal which tends to turn off the device, no portion of the current-conducting area of the device is physically widely spaced from the gate electrode. It is especially important that the relatively wider spine-portion of the cathode emitter is not a current-carrying portion of a device in accordance with this invention due to the fact that the anode emitter region 12 does not extend beyond the bases of the plurality of fingers of each cathode emitter portion. In this way it is assured that all portions of the device will be turned off by the application of an appropriately poled signal to the gate electrode and that current-squeezing with attendant large increases in current density will not occur either under the centers of the cathode emitter fingers, or under the spine portions of the cathode emitters as has heretofore been a problem leading, oftentimes, to device destruction during turn off in prior art latching transistors of the type to which this invention is addressed.

Figure 3:
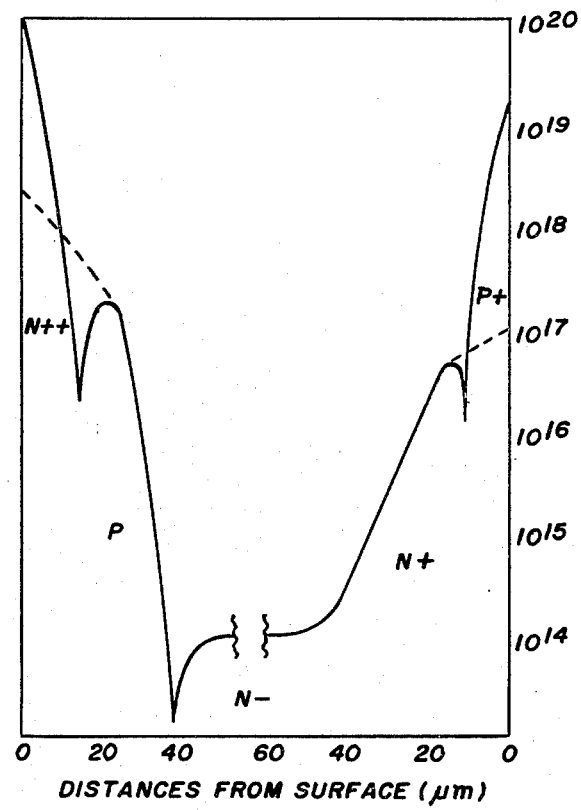
FIG. 3 is a graphical representation of the impurity concentration along line A—A of FIG. 1 of a device in accordance with this invention.

FIG. 3 is a graphical representation of the impurity concentration of the several regions of the device illustrated in FIG. 1 as would be expected to occur along a line A—A of FIG. 1 drawn through all four layers of the device, that is to say, the cathode emitter, first and second bases including the more heavily doped portion of the second base, and the anode emitter. Cathode emitter 22 has a surface concentration of about $10^{20}$ atoms/cm$^3$ and a depth of about 14 micrometers. First base layer 20 has a surface concentration of about $2 \times 10^{18}$ atoms/cm$^3$ at the surface of the device and a concentration of about $2 \times 10^{17}$ atoms/cm$^3$ immediately adjacent the junction between it and the cathode emitter. First base region 20 has a minimum thickness of about 37 micrometers. Cathode emitter region 22 and first base region 20 may be formed as is conventional by selective diffusion from an appropriate source into an n-type semiconductor wafer having a bulk impurity concentration of about $10^{14}$ atoms/cm$^3$. The more heavily doped portion of second base region 18 has a surface concentration of about $10^{17}$ atoms/cm$^3$ and a peak concentration adjacent the junction between it and anode emitter 12 of about $10^{16}$ atoms/cm$^3$. Anode emitter 12 is of p-conductivity type and has a surface concentration of about $10^{19}$ atoms/cm$^3$ and a depth, measured from the bottom surface of the device, of about 12 micrometers.

In accordance with a presently preferred embodiment of this invention, an n-conductivity type source wafer is provided which wafer has an impurity concentration of about $10^{14}$ atoms/cm$^3$ and comprises the n-type second base region of the device of FIG. 1. N+ type portion 18 of second base layer 14 is provided by the diffusion of an appropriate impurity as, for example, phosphorus from the bottom (as shown in FIG. 1) surface of the device to a surface concentration just less than about $10^{17}$ atoms/cm$^3$. Subsequently, p-type base layer 20 is formed by the diffusion of an appropriate acceptor impurity as, for example, boron, from the top surface of the device to a surface concentration of about $2 \times 10^{18}$ atoms/cm$^3$. Conveniently, cathode emitter regions 22 and 24 along with anode emitter region 12 may be formed simultaneously by the masked diffusion of phosphorus and boron, respectively, in a single diffusion step.

Figure 4:
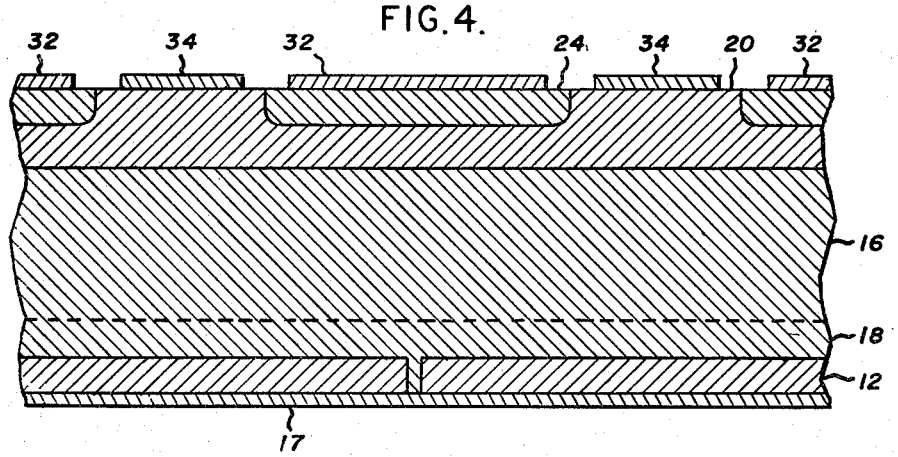
FIG. 4 is an enlarged, cross-sectional view of the device of FIG. 1 showing a single emitter finger.

FIG. 4 is an enlarged section view of a single cathode emitter finger and associated anode emitter region along with the base regions therebetween for illustrating the effect of the shorted anode emitter 12 and the heavily doped portion 18 of the second base layer.

Prior art gate turn-off devices have oftentimes been difficult to turn off. The turn-off mechanism has included a squeezing of the current-carrying plasma towards the center of the current-carrying portion of the device. This squeezing has resulted in very high current densities at the center of the current-carrying area which increases the gate current necessary for turn-off, and in the worst case, may result in destruction of the device due to excessive current density. In some cases, where insufficient gate current is available, the device remains on.

As may be readily observed, the short, in anode emitter 12 by anode electrode 17 under the center of cathode emitter 24 prevents the conduction of current by the center portion of each emitter finger of the device. In this way, as the plasma is squeezed towards the center of the fingers by the application of a turn-off signal to the gate, the extremely high current densities observed in the past are prevented from occurring. Similarly, since the anode emitter fingers terminate without extending under the spine of the cathode emitter, current is not conducted in that relatively wider region which includes portions physically remote from the gate electrode which would be difficult to turn off.

The addition of more heavily doped region 18 of second base region 14 provides additional advantages over the prior art in accordance with the teachings of this invention. The holding current of a latching transistor in accordance with this invention is inversely proportional to the sheet resistance of the n+ portion 18 of second base layer 14, and directly proportional to the injection voltage. Since the injection voltage is substantially constant, on the order of 0.7 volts, the holding current may be adjusted by varying the sheet resistance which in turn may be varied by modifying the impurity concentration of n+ layer 18. It has been determined that impurity concentrations in the range of $10^{16}$ to $10^{18}$ atoms/cm$^3$ provide a range of sheet resistivities usefully employed in practicing this invention. Those skilled in the art will understand that while this preferred range of impurity concentration is especially advantageously employed in accordance with the teachings of this invention the range may be departed from somewhat without diminishing the advantages of the particular structure herein described. In general, raising the sheet resistivity provides higher speed, faster turn off, and easier turn off, but at some sacrifice in forward voltage drop characteristics, that is to say, increasing the forward voltage drop and the saturation voltage as well as the gate triggering voltage requirements. By varying only the sheet resistivity of n+ layer 18, latching transistors in accordance with this invention may be provided having characteristics optimized for particular applications without the necessity for gross changes in the physical structure thereof.

Figure 5:
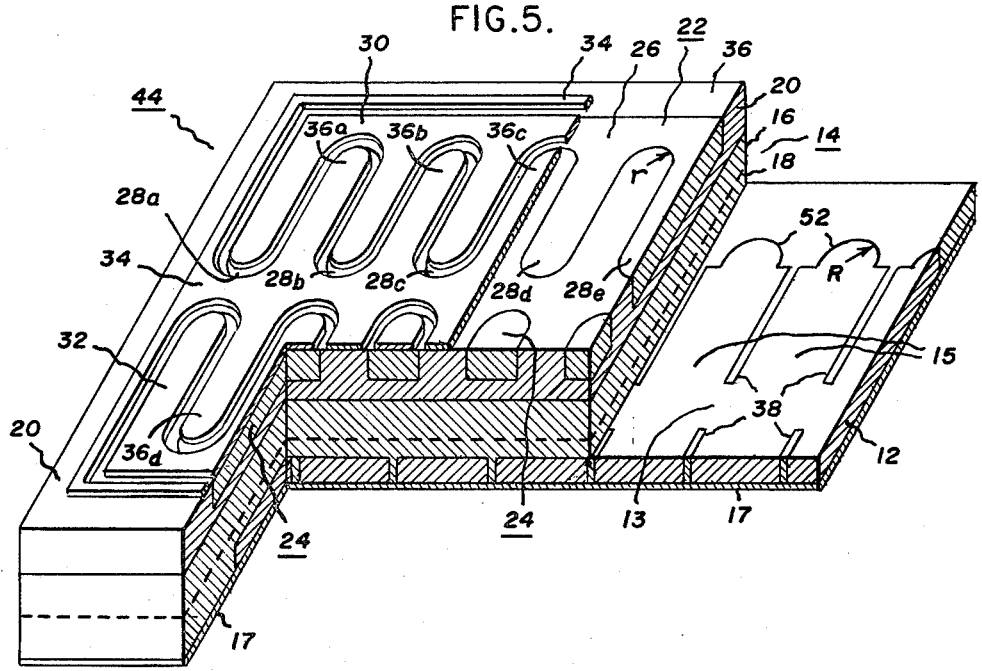
FIG. 5 is a cut-away, perspective view of a device in accordance with an alternative embodiment of this invention.
Figure 6:
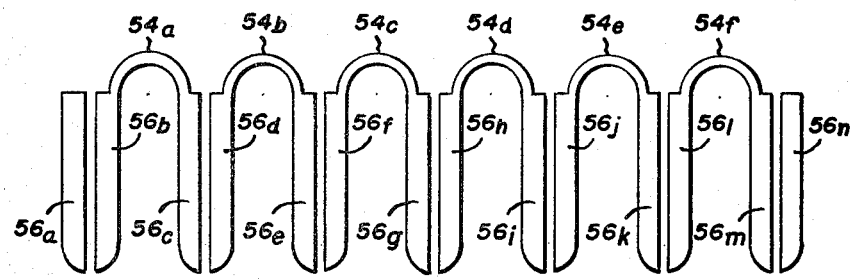
FIG. 6 is a plan view of the current-carrying portion of the device of FIG. 5.
Figure 6:
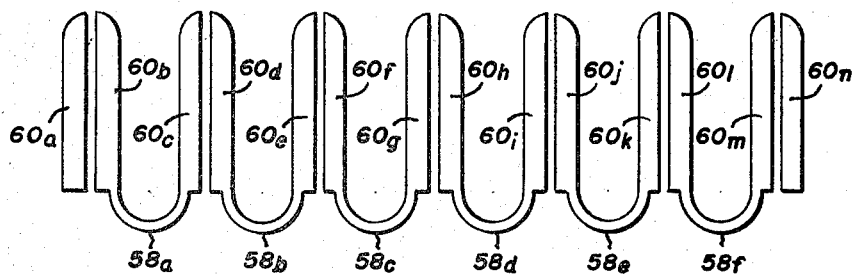

FIG. 5 is a cut-away view, similar to that of FIG. 1, of an alternative embodiment of a latching transistor in accordance with this invention which includes bridging regions for providing coupling between the current-carrying regions of the device to insure that in the case where turn on occurs first in one or more isolated locations of the 4-layer conducting structure, that the turn on will be uniformly spread throughout the current-carrying portion of the device. To this end, projections 52 extend from the ends of fingers 54 of anode emitter 12 under the spine portions of cathode emitter regions 24 and 26. The radii R of the projecting regions in accordance with the presently preferred embodiment of this invention are somewhat larger than the radii of curvature r of the juncture of cathode emitter fingers 24 and spine portion 26. In this way, 4-layer conducting regions 56 and 60 of the device, as are illustrated in FIG. 6 for the embodiment of this invention described in connection with FIG. 5, are provided which includes a plurality of connected current-carrying regions which are effective to insure the spreading of the current-carrying plasma between the several regions in the event that one or more of the regions turns on prior to the remainder of the regions. A composite view of the four-layer structure of the latching transistor of FIG. 5 is shown in FIG. 6. FIG. 6 shows an outline view of the portion of the device of FIG. 5 which is defined by the vertical coincidence of the cathode region 28, the first and second base regions 20 and 14, and the anode emitter 12. Therefor, FIG. 6 illustrates that portion of the entire device which is, in fact, a current-carrying portion when the device is in a conducting condition. Current-carrying portion 56a–n and 60a–n may be conveniently considered as occurring in pairs ab, cd, ef, etc., each of which pairs will be seen to have the shape and outside dimensions of the overlying cathode emitter finger and having omitted therefrom a central shorted portion having the shape and dimensions of the space between anode emitter fingers.

Alternating sections are joined by bridging regions 54a–f and 58a–f which have an outside radius equal to radius R of FIG. 5 which is the radius of anode projecting region 52 and an inside radius R which is the radius of the juncture of cathode emitter fingers 24 and spine portion 26.

The foregoing structure will be appreciated to include a plurality of pairs of discrete 4-layer sections, each pair being associated with a single cathode emitter finger and connected to the adjoining pair by bridging region 54 or 58, and all of which share the anode electrode of the device; for ease of comparison, the width of each of the finger portions which comprise a pair will be referred to as the emitter half-width (as in FIG. 2) and this width is labeled W. In accordance with a presently presented embodiment of this invention, the radii of projecting regions 52 are selected to provide a width in the 4-layer conducting structure which is less than the emitter half width W, hereinabove defined. In this way, it is insured that during turn-off those portions of the current-carrying structure of the device which underlie the spine regions of cathode emitters 22 and 24 are turned off at least as easily as the current-carrying portions of the device underlying the emitter fingers.

It is another feature of bridging regions 54 that the discontinuities in turn-on characteristics oftentimes found in prior art gate turn-off thyristors are substantially reduced. This is the result of the several current-carrying regions which heretofore have been discrete, connected only by the anode electrode herein being connected by bridging regions 54 which are 4-layer current-carrying regions, thereby insuring that continuous turn-on characteristics are provided.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A semiconductor switching device of the four-vertically-superimposed-layer gate-turn-off type having controllable emitter shorting and adapted to be turned both on and off by gate signals comprising:

a semiconductor body having first and second vertically separated and overlapping opposite major surfaces;

a first emitter region of a first conductivity type in said first surface having two spaced comb-shaped sections each including a relatively wide spine from which extends longitudinally and parallel to said first major surface a set of relatively narrow fingers with the fingers of each set extending toward but being spaced from the fingers of the other set;

first emitter electrode means on said first surface in ohmic contact with said first emitter region;

a first base region of a second conductivity type adjacent said first emitter region and forming a first p-n junction therewith, said junction terminating on said first major surface;

comb-shaped gate electrode means on said first major surface interdigitated with said first emitter region and in ohmic contact with said first base region, said gate electrode means being adjacent to but laterally spaced apart from said first p-n junction;

a second base region of said first conductivity type adjacent and vertically beneath said first base region and forming a second p-n junction therewith;

a control region of said first conductivity type adjacent and vertically beneath said second base region and spaced from the first base region by said second base region, said control region having a higher impurity concentration than said second base region;

a selectively shorted second emitter region of said second conductivity type adjacent said control region in vertically underlying relation with said first emitter region;

said second emitter region being situated in vertically underlying relation with essentially only that part of the first emitter region other than the spine portions of the first emitter region;

said second emitter region including a central spine region vertically underlying essentially the space between the two sets of first emitter fingers and further including a plurality of spaced second emitter fingers extending from said central spine region in vertically underlying relation with essentially only a part of the first major surface not occupied by the spine portion of the first emitter;

said second emitter fingers each including a projection extending from its end into vertical alignment with a spine portion of the first emitter region;

said second emitter region further having longitudinally extending apertures therein constituted by the spaces between the second emitter fingers, which apertures are narrower than said first emitter fingers and vertically aligned with only the laterally central portions of said first emitter fingers;

said control region extending through said apertures to said second major surface to form with said second emitter region a third p-n junction terminating on second major surface.

2. A semiconductor switching device of the four-vertically-superimposed-layer gate-turn-off type having controllable emitter shorting and adapted to be turned both on and off by gate signals comprising:

a semiconductor body having first and second vertically separated and overlapping opposite major surfaces;

a first emitter region of a first conductivity type in said first surface having a comb-shaped section including a relatively wide spine from which extends longitudinally and parallel to said first major surface a set of relatively narrow fingers;

first emitter electrode means on said first surface in ohmic contact with said first emitter region;

a first base region of a second conductivity type adjacent said first emitter region and forming a first p-n junction therewith, said junction terminating on said first major surface;

comb-shaped gate electrode means on said first major surface interdigitated with said first emitter region and in ohmic contact with said first base region, said gate electrode means being adjacent to but laterally spaced apart from said first p-n junction;

a second base region of said first conductivity type adjacent and vertically beneath said first base region and forming a second p-n junction therewith;

a control region of said first conductivity type adjacent and vertically beneath said second base region and spaced from the first base region by said second base region, said control region having a higher impurity concentration than said second base region;

a selectively shorted second emitter region of said second conductivity type adjacent said control region in vertically underlying relation with said first emitter region;

said second emitter region being situated in vertically underlying relation with essentially only that part of the first emitter region other than the spine portion of the first emitter region;

said second emitter region including a central spine region vertically underlying essentially the first base region and further including a plurality of spaced second emitter fingers extending from said central spine region in vertically underlying relation with essentially only a part of the first major surface not occupied by the spine portion of the first emitter;

said second emitter fingers each including a projection extending from its end into vertically underlying alignment with a spine portion of the first emitter region;

said second emitter region further having longitudinally extending apertures therein constituted by the spaces between the second emitter fingers, which apertures are narrower than said first emitter fingers and vertically aligned with only the laterally central portions of said first emitter fingers;

said control region extending through said apertures to said second major surface to form with said second emitter region a third p-n junction terminating on said second major surface.

* * * * *